(12) United States Patent
Pons Gonzalez

(10) Patent No.: US 9,413,103 B2
(45) Date of Patent: Aug. 9, 2016

(54) COMPACT CONNECTION SYSTEM FOR MAINS SWITCHGEAR

(71) Applicant: SMILICS TECHNOLOGIES, S.L., Terrassa (ES)

(72) Inventor: Carles Pons Gonzalez, Terrassa (ES)

(73) Assignee: SMILICS TECHNOLOGIES, S.L., Terrassa, Barcelona (ES)

( * ) Notice: Subject to any disclaimer, the term of this patent is extended or adjusted under 35 U.S.C. 154(b) by 113 days.

(21) Appl. No.: 14/351,583

(22) PCT Filed: Oct. 17, 2012

(86) PCT No.: PCT/ES2012/070715
§ 371 (c)(1),
(2) Date: Apr. 14, 2014

(87) PCT Pub. No.: WO2013/060912
PCT Pub. Date: May 2, 2013

(65) Prior Publication Data
US 2014/0287602 A1    Sep. 25, 2014

(30) Foreign Application Priority Data
Oct. 28, 2011   (ES) .................. 201131742

(51) Int. Cl.
| H01R 11/30 | (2006.01) |
| H01R 13/62 | (2006.01) |
| G01R 15/14 | (2006.01) |
| G01R 1/04 | (2006.01) |
| H01H 9/02 | (2006.01) |
| H01H 9/16 | (2006.01) |
| H01H 71/02 | (2006.01) |
| H01H 71/04 | (2006.01) |

(52) U.S. Cl.
CPC ............ *H01R 13/6205* (2013.01); *G01R 15/14* (2013.01); *G01R 1/0416* (2013.01); *H01H 9/0264* (2013.01); *H01H 9/168* (2013.01); *H01H 71/0228* (2013.01); *H01H 2071/042* (2013.01); *H01H 2071/044* (2013.01)

(58) Field of Classification Search
CPC .......... H01R 13/6205; H01R 13/2421; H01R 9/2675; H01R 9/26; H01R 9/248; H05K 7/1478
USPC ............................ 439/39, 700, 715–717, 928
See application file for complete search history.

(56) References Cited

U.S. PATENT DOCUMENTS

| 5,921,783 | A  * | 7/1999 | Fritsch | H01R 13/703 439/38 |
| 6,475,036 | B2 * | 11/2002 | Morikawa | H01R 13/6395 439/716 |
| 6,573,617 | B2 * | 6/2003 | Jones | H01R 13/514 307/11 |
| 6,692,311 | B1 * | 2/2004 | Kamei | H01R 9/2458 439/218 |
| 6,881,101 | B2 * | 4/2005 | Sichner | H01R 13/514 439/278 |
| 6,966,781 | B1 * | 11/2005 | Bullinger | H01R 13/6205 439/289 |
| 7,645,143 | B2 * | 1/2010 | Rohrbach | H01R 13/6205 439/218 |

(Continued)

*Primary Examiner* — Thanh Tam Le

(57) ABSTRACT

An easy-to-assemble compact connection system can be connected to a mains via connection to different switchgear devices, such as a residual-current or thermomagnetic circuit breaker, switches, contact breakers, overvoltage protectors or similar devices, in order to collect or inject signals available on the mains, such as collecting current or voltage signals from the mains or collecting or injecting other signals or parameters. The compact connection system can be connected to both switchgear devices already installed in a switchboard and to new units.

22 Claims, 5 Drawing Sheets

(56) References Cited

U.S. PATENT DOCUMENTS 7,775,801 B2 * 8/2010 Shiff ................. H01R 13/6205 439/39

7,901,216 B2 * 3/2011 Rohrbach .......... H01R 13/6205 439/39

* cited by examiner

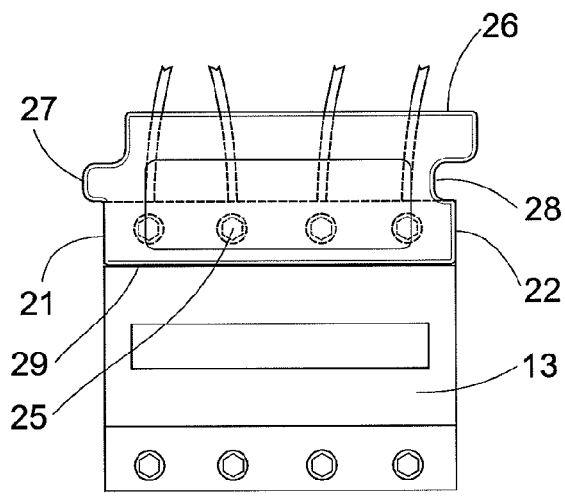
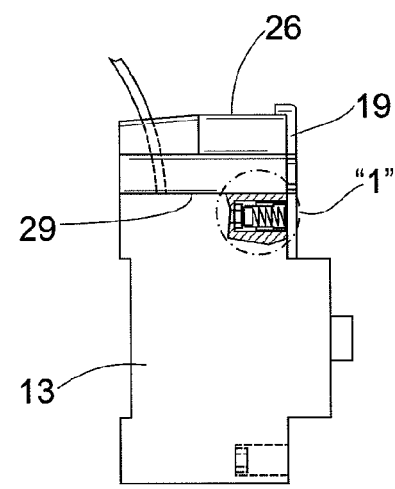
Fig. 5          Fig. 6
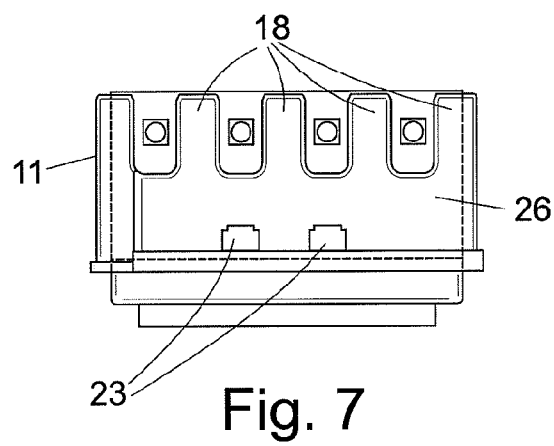
Fig. 7

Detalle "1"

Detalle "1"

COMPACT CONNECTION SYSTEM FOR MAINS SWITCHGEAR

FIELD OF THE INVENTION

This invention relates to an easy-to-assemble compact connection system that can be connected to the mains via connection to different switchgear devices, such as a residual-current or thermomagnetic circuit breaker, switches, contact breakers, overvoltage protectors or similar devices, in order to collect or inject signals available on the mains, such as collecting current or voltage signals from the mains or collecting or injecting other signals or parameters.

The compact connection system can be connected to both switchgear devices already installed in a switchboard and new units.

STATE OF THE ART

Switchgear devices, such as contact breakers, switches, residual-current or thermomagnetic circuit breakers, or overvoltage protectors have been on the market for several decades. These are installed on electrical switchboards in an installation and are generally fitted one beside the other on a standard, DIN type rail.

Currently there exist on the market a wide range of systems or devices for measuring electric parameters to which the switchgear devices are subject to, namely the voltage present at their terminals and the current which flows through them when the mains is connected, so as to obtain data of these parameters in a certain moment of time (namely taking a spot measurement) or in a continuous period (i.e., permanent measurement taking).

In any case, current conventional measurement systems or devices are principally clamp ammeters, transformers or "shunts" to measure current and voltmeters for voltage measurement.

Permanent bulky devices placed next to the switchgear devices are also known, and they require some time to install the measurement device, during which the mains supply will be disconnected.

In addition, in most cases, the user or installer of the measurement device will have to modify the electrical switchboard to be able to fit these measurement devices permanently or temporally, bearing in mind that in many cases these electrical switchboards are completely full of switchgear devices and free space available for housing these measurement devices is very limited or non-existent, and therefore the electrical switchboard must be modified and enlarged, which takes a great deal of the installer's time, costs money for the user as well as the inconvenience of the time the power is cut for users of the electrical installation which supplies the switchgear device.

OBJECT OF THE INVENTION

The object of this invention is to design a connection system to any switchgear device, which will be compact, easily fitted to it by magnetic and compact fastening means, the purpose of which is to connect to the mains via the switchgear device, and to be able to collect and/or inject signals which are available in the mains, at least the signal(s) of mains voltage and additionally other signals such as current signals or other parameters.

Another object of this invention is that the connection system can be connected to both switchgear devices already installed in a switchboard and new units, namely it is a universal type.

Another object of this invention is that the connection system can be fitted and removed very easily by the user and that it can be installed on a switchgear device of any type with live mains, namely without needing to disconnect the supply or modify the layout of the any of the switchgear devices on the electrical switchboard.

Another purpose of this invention, and one of its main advantages is that it saves space in the electrical switchboard, this being very critical in electrical installations, so that the compact connection system can be fitted in the existing space, just on top of the switchgear device, and it has exterior dimensions that do not project (or at least not significantly) in width or length beyond the exterior dimensions of a switchgear device.

And finally, another object of the this invention is to design a connection system, which in addition to connecting to the mains via the switchgear device, it optionally has means for the subsequent processing of the parameters obtained, and optionally to obtain other parameters which can be derived from the analysis of the voltage, current and/or other parameters obtained by this connection system to the mains; as well as having means for transmitting these parameters obtained from the mains or from the work location of the switchgear device to an external device for subsequent processing or management.

DESCRIPTION OF THE INVENTION

The object of this invention is claimed in claim 1.

This invention refers to a compact connection system to the mains via the connection of said connection system to a switchgear device already installed or of those which are conventionally installed to the mains, fitted onto a DIN type rail or similar device, characterised by the fact that said connection system is a compact element that can be fitted and removed without mechanical connections (namely without terminals or any wiring) to the surface of a switchgear device of any type (for example: a thermomagnetic circuit breaker, or residual-current circuit breaker, or contact breaker, or switch, or transformer, or overvoltage protector) and, the compact connection system comprises at least:

a plug & play type means for magnetic fastening and connection to the switchgear device, which immobilises the connection element to the switchgear, and in turn connects electrically these magnetic fastening means to the respective connection screws, terminals or clamps of the switchgear device, so the connection system using these magnetic fastening and connection means may collect signal(s) from the mains or inject signals into the mains.

Optionally and preferably, the connection system includes means for sensing and/or injecting current signals that flow through each of the poles, sensing the magnetic field present in each mains line and/or the effects of the signals injected.

Also optionally, other sensing means can be included in the connection system to measure different parameters or signals apart from voltage and current, such as temperature, moisture, vibration and/or acceleration, presence/movement/proximity or GPS sensors (including the date, time and place of installation), GPRS, and/or lighting sensors. Thus, by providing presence/movement/proximity sensors, it may be possible to detect when someone comes close to an electrical switchboard and could cause damage or undesirable manipulation, or by providing GPS sensors, the compact connection system may be used for instance for detecting or controlling maintenance in different places or geographical locations.

In some cases, the means for sensing current could be replaced or complemented by some means for sensing other parameters, namely at least a temperature, moisture, vibration, moisture, vibration and/or acceleration, presence/movement/proximity or GPS, and/or lighting sensor.

Regarding means for sensing and/or injecting current signals, field tests have been made and several types of sensors or transducers have been discovered as satisfactory for this purpose. With regard to means for sensing current signals, such as for example (but not limited to) at least one, more than one or a combination of different types of sensors or transducers (and all the following sensors or transducers in their two variants, open core and closed core) can be used satisfactorily:

air core (Rogowski coil),
iron core,
optical,
magnetoresistive,
Hall effect,
Null balance current sensors or
hybrids.

In most cases, switchgear devices have points to connect to the mains (one for each pole), which may be placed at the top and/or in bottom of the switchgear device and that are generally located on the inside of the respective holes or housings. There are different configurations or variations of these connection points, such as connection screws, connection terminals, connection clamps, or any metal point for securing or connecting the wiring of the switchgear device.

According to a preferred embodiment of this invention, the above mentioned plug & play type means for magnetic fastening and connection comprise a magnetic type plug & play fastening and connection element for each of the poles of the switchgear device, which are attached and connected respectively to each of the connection screws, terminals or clamps of the switchgear device, located normally inside some holes.

After numerous field tests to design this connection system in the most compact and efficient manner possible, the final design was a very efficient connection system which is built into a single body, where the magnetic fastening and connection elements responsible for collecting and/or injecting the voltage signal(s) from the mains where they are fitted, having a minimum distance "A" in the sensors and/or signal injector(s), to minimise possible magnetic interference caused by magnetic elements on the correct operation of these sensor and/or injecting devices. In addition, it is optionally possible to incorporate means for internal magnetic screening to reduce and even eliminate any undesired influence of internal and/or external magnetic fields. Numerous field studies carried out by the applicant have concluded that this minimum distance value "A" must be at least 8 mm for optimum effectiveness of the connection system of the present invention (namely without significant interferences).

According to one of the preferred embodiments of the invention, each magnetic fastening and connection element has at least a degree of play in direction of "Z" axis—corresponding to the depth of the switchgear device—which allows each magnetic fastening and connection element to move in the "Z" direction independently, so it can adapt to the small variations in depth of each connection screw and/or terminal of each type or model of switchgear device, so it can easily connect to them, thanks to elastic means which enable this "Z" direction movement. This "Z" direction adjustment greatly facilitates the placement and removal of the magnetic fastening and connection elements and therefore the entire compact connection system to/from the front surface of a switchgear device at the moment of its installation, so that the user when placing the magnetic fastening and connection elements in their respective housings in the switchgear device, both parts can be connected immediately and almost automatically because of the strength of magnetic attraction of the magnetic fastening and connection elements against the respective screws and/or connection terminals of the switchgear device.

According to a possible embodiment of the present invention, additionally or alternatively to the capacity to move in the "Z" axis direction, the plug & play type magnetic fastening elements have a degree of play to move in the "Y" axis direction—corresponding to the vertical axis of the switchgear device—in order to adapt perfectly to different height geometries and configurations of other switchgear devices installed in the electrical switchboards, the external configurations and geometries of which may vary slightly. These graduations in the "Z" and "Y" axes make the compact connection system presented here totally universal, as it can be installed automatically and perfectly fitted to any type or model of switchgear device.

Preferably these magnetic elements are built into the front part of each of the magnetic fastening elements, and the strength of the magnets is calculated so that a user when manually pulling outwards can easily release the magnetic elements from the metal screws and/or terminals of the switchgear device, thereby freeing the compact element from the switchgear device. Likewise, this magnetic strength is such that the compact element will be attached and remain attached temporally or permanently to the metal screws and/or terminals of the switchgear device, without the compact element becoming detached after being fitted.

The magnetic elements are magnets preferably placed in the front of the elongated elements that comprise the magnetic fastening and connection elements, and these elongated elements are adapted to be inserted perfectly into the housings in the switchgear devices inside which there are metal screws or terminals or clamps (depending on the specific case).

The applicant has calculated the correct strength of attraction of the magnets with extensive tests and experiments, so the connection system of the invention works optimally, i.e., that is does not become detached easily during its life when fitted to a switchgear device, while at the same time being easy to fit and remove manually (and without tools) by a user, and enabling the collection of correct signals from the mains (i.e., precise and without distortion).

More specifically, several tests carried out on different 4-pole switchgear devices (The most common type), have determined that the connection system must have a removal strength of about 5 Newton for removal of the connection system to be easy while at the same time being firmly attached to the switchgear device. This strength is approximately 10 Newton when detaching it from a flat ferrous magnetic surface. The strength of attraction of the magnets to achieve these values has been determined, although it could be modified if necessary, by using different materials. Normally the strength for removal is proportional to the number of magnets used.

Additionally, the connection system described in this invention comprises inside some means for processing these voltage and/or current parameters or captured or injected signals and/or other parameters, including means for processing, the corresponding hardware and software to carry out these signal processing actions and/or functions for these parameters or signals.

These processing actions and/or functions or measurements obtained by these means for processing the parameters or signals may be, as an example (but not limited to) the following:

Mains voltage and quality parameters related to variation, e.g.: fluctuations, flickering, gaps, interruptions, transitory and/or temporary overvoltages, low voltages, unbalance between phases, harmonic and an harmonic voltages; and/or Current through the switchgear device and its harmonics; and/or Frequency; and/or Power; and/or Energy; and/or Record the action of protection devices such as residual-current and/or thermomagnetic circuit breakers. With suitable devices it would be possible to determine the date, time and place (GPS) of the incident; and/or Testing correct functioning of residual-current or thermomagnetic circuit breakers without having to remove them from the switchgear panel; and/or Aging of switchgear devices, i.e. overvoltage protectors; and/or Determination of the impedance of the mains; and/or Temperature and/or moisture in the location where the device is installed; and/or Presence detection; and/or Light detection; and/or Transmission and/or reception of information via cable, wireless and/or through the mains.

These applications could be carried out by a single device or by several interconnected connection systems, for instance by master/slave or similar type structures.

Additionally, the connection system presented here may comprise some means for transmitting or communicating these parameters or signals to an outside management and/or data storage device (e.g. PCs or data networks), this transmission could also be wireless, such as Wi-Fi or Bluetooth, or alternatively by non-wireless means connectable via connection pins or similar devices in the system for this purpose. This external device can perform the desired actions in each case, such as alarm management when the detected signals exceed a pre-set limit parameters, control tasks and/or monitoring of one or more processes, among other possible functions, by the corresponding software and hardware designed for this purpose.

Optionally, the connection systems presented here can include means to display or indicate (e.g. display) the parameters detected and/or processed, such as a screen, so that a user can view the measurements taken by the system and/or other parameters obtained from these measurements from a desirable place in the connection system.

According to one embodiment of the invention, the connection system incorporates a common plate in its front part, which acts as a support plate, and also facilitates the operation and positioning and removal by the user of the connection system in the switchgear device. In addition, if it has a touch screen, this may be placed on this common plate.

With the aim of fitting two connection systems side by side without any gap between them, for instance when there are several switchgear devices installed on a DIN rail, one next to the other, the connection system presents an advantageous configuration and exterior perimeter geometry designed in such a manner that two connection systems can be perfectly fitted side by side, the side of to first connection system with the surface side of a second connection system beside it.

Therefore, the assembly formed by at least two interconnected connection systems, preferably fitted side by side is also an object of the invention.

The geometric shape of the connection system presented here is not exhaustive, in the sense that it may be modified to enable the installation of several measurement devices next to each other, either side by side or vertically, adapted to the specific dimensions of a switchgear device or improvements on the sensing and/or signal injection functions.

Advantageously, thanks to its efficient configuration, the connection system of the invention can be interconnected with other connection systems installed in switchgear devices related or interconnected to each other, namely for instance in master/slave type or similar structures. In this manner, for instance, a connection system could receive signals from other nearby connection systems or send them, also managing these signals.

Therefore, the connection system presented here is able to capture current flows circulating through each pole, sensing the electromagnetic field present in each mains line by sensing the current for each pole, and is also able to detect the voltage signal in the switchgear device by magnetic means, which as they are electrical conductors with negligible resistance, on the one hand contact the respective screws and/or terminals where the external conductors are connected to the switchgear device, which is subject to the voltage present in these conductors, and on the other hand, transfer this voltage to the internal circuits of the connection device.

In addition, the connection system object of the invention, thanks to its innovative universal configuration, is not only usable on any type of switchgear device, but it can be used without distinction in single phase or multi-phase supply systems, in their different configurations and variations.

In addition, this connection system is carefully designed to present very small exterior dimensions, comparable to the switchgear devices, enabling them to be installed to the upper and/or in lower part of an existing switchgear device, so it does not occupy any space in width or length (or not significantly), thus achieving a saving of space in the electrical switchboards, this being a highly critical parameter in electrical installations.

Thus, the connection system object of the invention is fitted preferably in the space over the switchgear device, and it has external dimensions that do not significantly project in width or length beyond the exterior dimensions of a switchgear device, which are generally standard, so the side spaces next to the switchgear device or devices are totally free, which may be very useful for housing other switchgear devices on the electrical switchboards, space being therefore a very critical element in electrical switchboards. As can be seen in the drawings below, both the switchgear devices and the connection devices can be fitted side by side, without gaps between them and without increasing the dimensions of the frame where they will be installed.

This innovative and advantageous saving of space allows the user to install the connection system in a very short time and without tools, just by positioning it, the connection is instant by magnet means, without needing to handle or modify the installation of the switchgear device or switchgear devices installed beside it, for instance adding modules on a DIN rail.

Therefore, this connection system is non-invasive and can be fitted to switchgear devices already installed on a electrical switchboard with live mains, without needing to cut the power supply or modify and/or enlarge the panel, which means a great saving of time, space, and cost, on the other hand it eliminates the inconvenience to users of disconnecting the power supply during the installation process of the measurement and control systems currently on the market. Similar advantages are obtained in new installations, as for the same space, it is possible to obtain more functions, reducing the wiring in the switchboard, the time needed to carry out the installation and its cost.

In short, the connection system presented here has many advantages which make it much more convenient for the user: quick to install and uninstall in comparison to existing connection systems and sensors, and totally versatile for installation on any existing type of switchgear device without needing to cut the power supply or modify the electrical switchboard.

These and other characterizing features will be best made apparent by the following detailed description whose understanding will be made easier by the accompanying four sheets of drawings showing a practical embodiment being cited only by way of example not limiting the scope of the present invention.

DESCRIPTION OF THE DRAWINGS

In the drawings:

FIG. 5 shows a front elevation view of the same preferred embodiment connection system of FIG. 1, mounted on upper part of a conventional switchgear device;

FIG. 6 shows a side elevation view of the same preferred embodiment of the connection system mounted on a conventional switchgear device of FIG. 5;

FIG. 7 shows a top plan view of the same preferred embodiment of the connection system mounted on a conventional switchgear device of FIG. 5;

Figure 1:
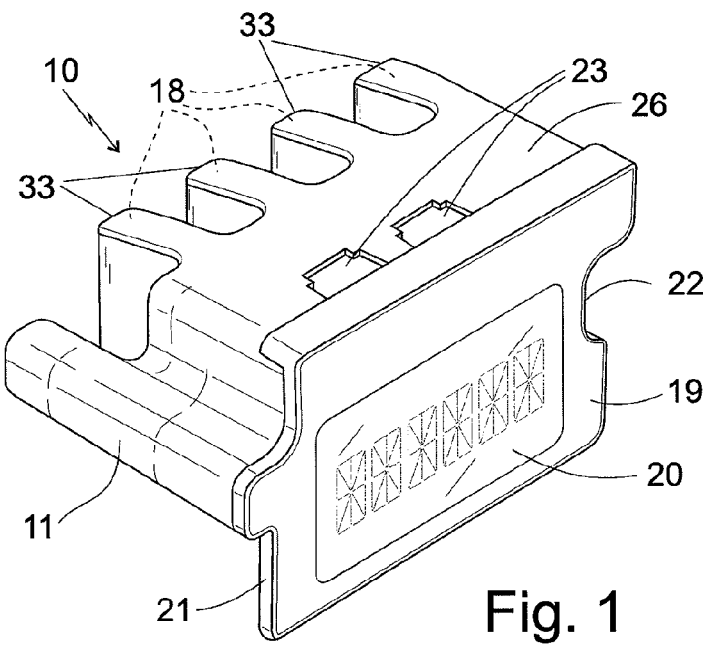
FIG. 1 shows a front prospective view of a preferred embodiment of the connection system as claimed in this invention.

Below is a list of the different parts of the invention, which are indicated in the following Drawings with their respective numbers; (10) connection system with magnetic fastening means, (11) exterior body of the connection system (10), (13) switchgear device, (14) front base of the switchgear device, (15) upper housings for the electrical connection screws and/or terminals, (16) magnetic fastening and connection elements, (17) magnetic elements, (18) means for sensing and injecting current signal(s), (19) front plate of the exterior body (11), (20) screen, (21) side surface of the exterior body (11), (22) opposite side surface of the exterior body (11), (23) housings for connection pins for transmission and reception of signals, (24) springs, (25) metal screws or terminals for connection, (26) upper base of the exterior body (11), (27) part projecting from the side surface (21), (28) hollowed portion of the opposite side surface (22), (29) upper base of the switchgear device (13), (30) fixed cylindrical rear portion of the magnetic fastening elements (16), (31) mobile cylindrical front portion of the magnetic fastening and connection elements (16), (32) elongated holes for the "Y" axis adjustment, (33) rear extensions of the exterior body (11).

EXAMPLE OF A PREFERRED EMBODIMENT OF THE INVENTION

One of the preferred embodiments of this invention is shown in the attached drawings.

Figure 2:
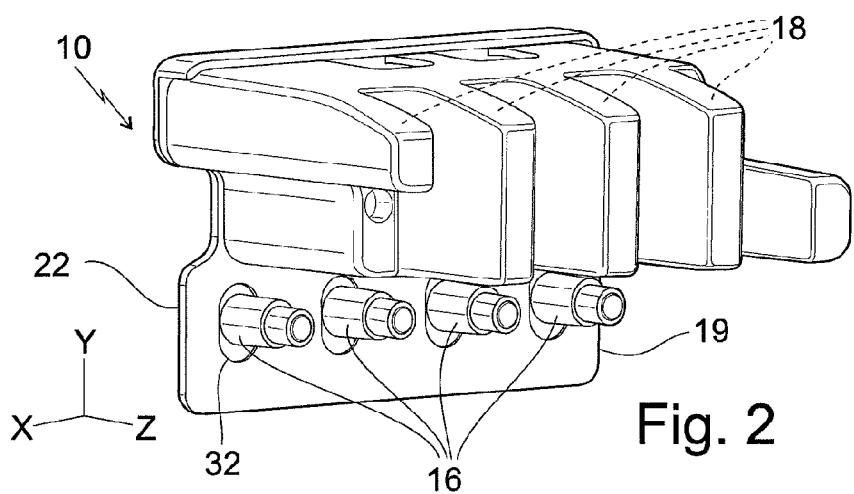
FIG. 2 shows a rear prospective view of the same preferred embodiment of the connection system of FIG. 1.
Figure 4A:
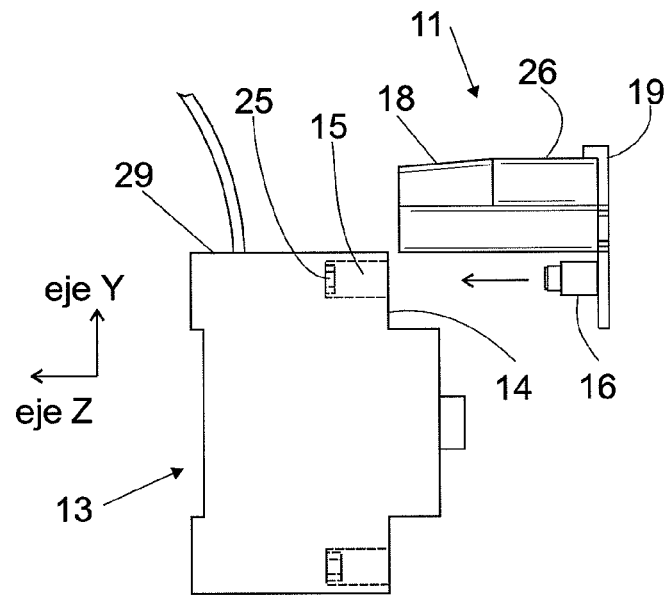
FIG. 4a shows a side elevation view of the same preferred embodiment connection system of FIG. 1, in which its installation position on a conventional switchgear device can be seen.
Figure 4B:
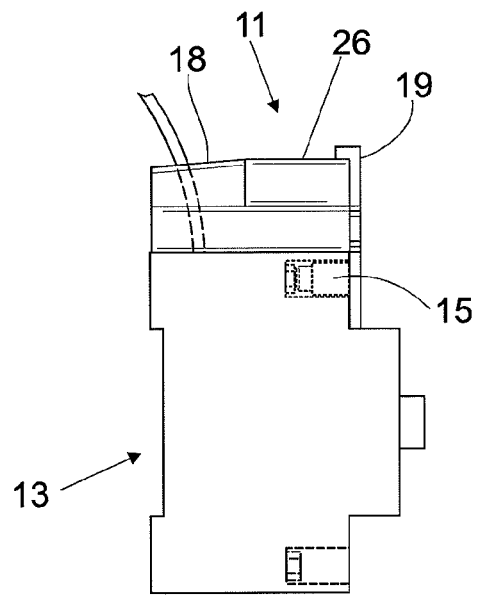
FIG. 4b shows the same side elevation view of FIG. 3, in which the connection system is duly installed on the conventional switchgear device.

Specifically, in FIGS. 1 and 2, a preferred embodiment of the connection system (10) object of this invention can be seen, including the aforementioned connection system (10) at the bottom part, a substantially cylindrical, plug & play type magnetic fastening and connection elements (16), fitted on the inside of the respective upper housings (15) of the switchgear device (13) until they come into contact with the respective heads of the screws (25), the connection system (10) is securely attached to the switchgear device (13), and by the other the electrical connection of said magnetic fastening and connection elements (16) to the respective heads of the connection screws (25), terminals or clamps (25) existing in the respective housings (15) of the switchgear device (13) (see FIGS. 4a and 4b).

As can be seen in FIG. 2, the magnetic fastening and connection elements (16) are formed by a fixed cylindrical rear portion (30) and a mobile cylindrical front portion (31) the front cylindrical portion (31) can be moved axially inside the fixed cylindrical rear portion (30), and having a magnet (17) at front of the mobile cylindrical portion (31). This magnet (17) has a minimum distance "A" from the sensors and current signal injectors (18) to avoid any type of interference (see FIG. 3).

Figure 8A:
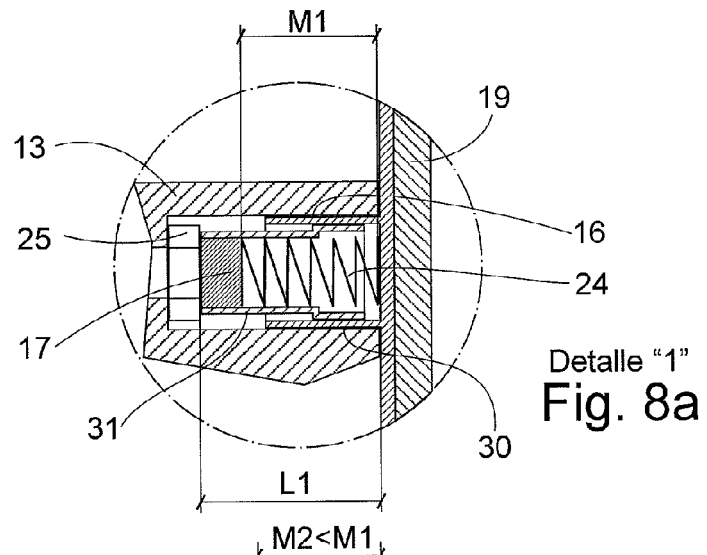
FIG. 8a shows a view of detail "1" of FIG. 6, in which the configuration of the means of magnetic attachment installed in a switchgear device can be seen with greater clarity, with a depth of screws "L1", so that the spring is at a distance of "M1"
Figure 8B:
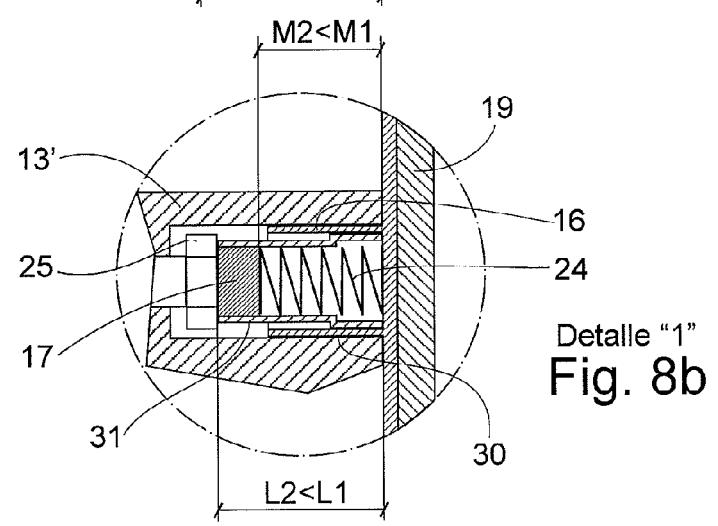
FIG. 8b shows a view of detail "1" of FIG. 6, in which the configuration of the means of magnetic attachment installed in a switchgear device can be seen with greater clarity, with a depth of screws "L2", so that the spring is at a distance of "M2"

According to this particular configuration of the magnetic fastening and connection elements (16), there is a degree of play in the "Z" axis of the magnetic elements (17) thanks to some springs (24) which enable the adjustment in the "Z" direction as shown clearly in FIGS. 8a and 8b, which show two installations of the same connection system (10) but on two different switchgear devices (13, 13'), with a depth of positioning of the screw head (25) distance "L1" and "L2" respectively, where "L2"<"L1". To adapt to these different depths, the spring (24) contracts, so the mobile front portion (31) moves inside the fixed rear portion (30).

Figure 3:
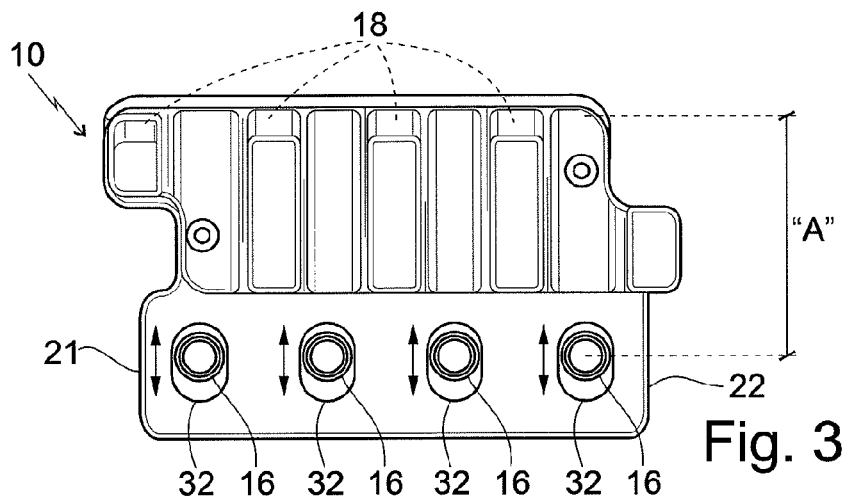
FIG. 3 shows a rear elevation view of the same preferred embodiment of the connection system of FIG. 1, in which movement on the "Y" axis of the magnetic elements with regard to the connection system have been indicated.

In this particular case, in addition, the plug & play type magnetic fastening elements have a degree of play in "Y" direction, —corresponding to the vertical axis of the switchgear device—, see FIG. 3, so as to adapt perfectly to the different variations in height of the housings (15) for the connection screw heads (25) of the different models of existing and installed switchgear devices (10) in current electrical switchboards.

In this specific embodiment, the included drawings show a means for sensing and injecting the current signal(s) (18), split-core sensors in this case, one for each of the four poles, which are concealed under the surface of the rear extensions (33) of the exterior body (11).

Additionally, the connection system (10) described in this invention may comprise inside some means for processing these voltage and/or current parameters or captured or injected signals and/or other parameters, as well as means for transmitting or communicating these measured parameters or signals to an external management and/or data storage device; although they have not been included in the attached drawings, as they are on the inside of the body or external casing (11). Only the corresponding housings (23) have been drawn, which are used to connect the respective connection pins or similar elements of the respective transmission cables, which send or receive data to or from an external device wirelessly (see FIG. 1).

In a preferred embodiment, and as can be seen in the attached drawings, the connection system (10) incorporates a plate (19) in its front part, which acts as a support plate, and also facilitates the operation and positioning and removal by the user of the connection system in the switchgear device. In addition, in this particular case, the support plate (19) has an incorporated screen for viewing data (20), so a user can see the measurements or values collected by the system and/or other values obtained from these detected measurements (see FIG. 1).

Figure 9:
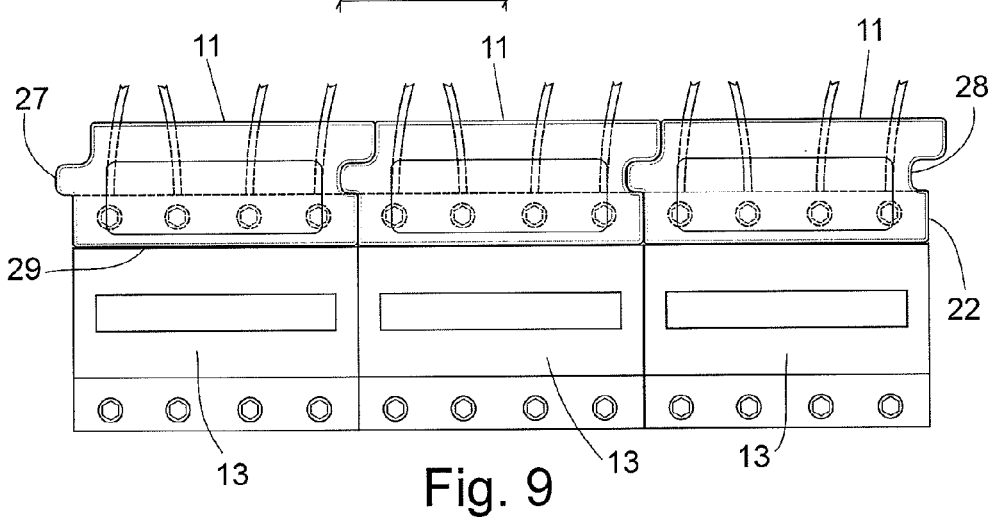
FIG. 9 shows a front elevation view of a plurality of connection systems according to the embodiment of FIG. 1 fitted onto the respective conventional switchgear devices side by side.
Figure 10:
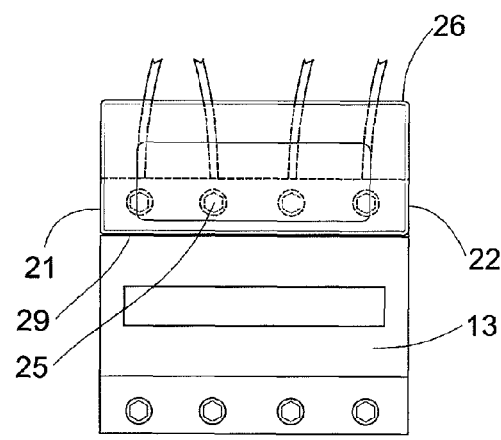
FIG. 10 shows a front elevation view of a second preferred embodiment connection system mounted on upper part of a conventional switchgear device.
Figure 11:
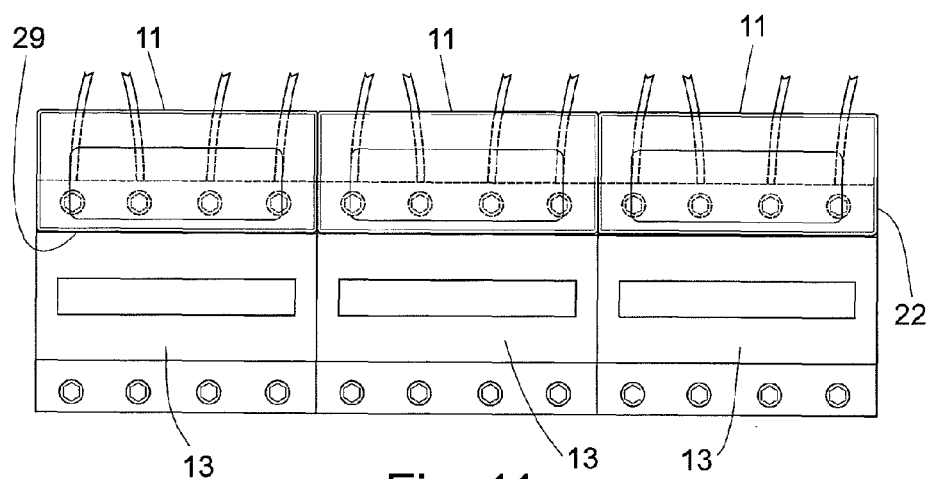
FIG. 11 shows a front elevation view of a plurality of connection systems according to the second embodiment of FIG. 10 fitted onto the respective conventional switchgear devices side by side.

As can be observed in FIG. 9, with the aim of fitting two connection systems (10) side by side, for instance when there are several switchgear devices installed on a DIN rail din, one next to the other, this connection system (10) has left (21) and right (22) side surfaces adapted for fitting together, by a projection (27) on the left hand side (21) which fits perfectly into the respective hollowed portion (28) on right hand side (22) of the next unit.

The connection system (10) is very small, so it does not project substantially in width or length beyond the exterior dimensions of a switchgear device (13) (see FIGS. 5, 6 and 7).

Having sufficiently described this invention, with correspondence to the attached illustrations, it is easy to see that any sort of modification deemed necessary can be introduced as long as they do not change the essence of the invention, which is summarised in the following claims:

The invention claimed is:

1. A compact connection system for a mains switchgear, comprising:
    a magnetic fastening element attached to at least one compact connection element by which the compact connection element is connectable to a switchgear device without mechanical connections;
    a body, wherein the compact connection element is attached to the body and the compact connection element operatively connects the body to the switchgear device;
    the magnetic fastening element being electrically connectable to a corresponding connection point or to any metal point for securing or connecting the wiring of the switchgear device, such that the compact connection system may receive an electrical signal from the mains switchgear connected to the switchgear device or send an electrical signal into the mains switchgear;
    the compact connection element being removably connectable to the switchgear device and configured to collect at least voltage signals from the mains switchgear when connected via the switchgear device; and
    a means for sensing and/or injecting current signals that flow through poles of the switchgear device, wherein a magnetic field present in the mains switchgear and/or effects of injected signals are detected.

2. The system of claim 1, wherein the means for sensing are used to measure signals apart from voltage and current, such as temperature, moisture, vibration, and/or acceleration, presence, movement, proximity, GPS sensors, including date, time and place of installation, and/or lighting sensors.

3. The system of claim 2, further comprising at least one, more than one, or a combination of different types of sensors or transducers, whereby both open core and closed core can be used, namely air core or Rogowski coil, iron core, optical, magnetoresistive, Hall effect, Null balance current sensors or hybrids.

4. The system of claim 1, wherein the system contains compact connection elements corresponding to each pole of the switchgear device, wherein the magnetic element is attached to each compact connection element and operatively connects the compact connection elements to the corresponding connection point on each pole of the switchgear device.

5. The system of claim 1, wherein the magnetic fastening element is positioned at least 8 millimeters from the means for sensing and/or injecting current signals to minimize magnetic interference.

6. The system of claim 1, further comprising a means for internal magnetic screening to reduce undesired influence of internal and/or external magnetic fields.

7. The system of claim 1, wherein the compact connection element is axially compressible, whereby the compact connection element is adaptable to variations in depth of a connection point housing in the switchgear device.

8. The system of claim 1, wherein the compact connection element is vertically movable in order to adapt the compact connection element to fit into different height geometries and configurations of switchgear devices.

9. The system of claim 1, wherein the compact connection element has a rear fixed portion and a mobile front portion that is axially compressible and is elongated to fit into a housing in the switchgear device, inside of which is the corresponding connection point, and the magnetic fastening element is attached to the mobile front portion, whereby the magnetic fastening element can securably attach and easily detach the system from a switchgear device.

10. The system of claim 1, wherein the body houses a processor means for processing voltage and/or current parameters or captured and/or injected signals and/or other parameters.

11. The system of claim 10, further comprising a transmission means for transmitting or communicating parameters or signals measured or processed by the processor means to an outside management and/or data storage device, such as a PC or a data network.

12. The system of claim 11, wherein the transmission means is of a wireless type, such as Wi-Fi.

13. The system of claim 11, wherein the transmission means is of a non-wireless type, connectable via connection pins or similar devices in the system.

14. The system of claim 1, further including display means for displaying or indicating detected, injected and/or processed parameters, such as a touch screen, so that a user can view the values of the measured parameters.

15. The system of claim 1, wherein the compact connection element is fitted on a common plate, which is attached to the body, that acts as a support, and also facilitates the operation and positioning and removal by a user of the system with the switchgear device.

16. The system of claim 1, further including side fitting means adapted for fitting a side surface of a first compact connection system to an opposite side surface of a second compact connection system.

17. The system of claim 16, wherein the side fitting means enable a side attachment between the side surface of the first compact connection system to the opposite side surface of the second compact connection system without a gap between the side surface of the first compact connection system and the opposite side surface of the second compact connection system.

18. A series compact connection system for mains switchgear, comprising at least two of the compact connection systems described in claim 1, wherein the compact connection systems are joined side by side, and the compact connection systems are connected with other compact connection systems installed in related or interconnected switchgear devices, in master/slave type or similar structures, such that the compact connection systems of the series compact connection system could receive or send signals from other compact connection systems not connected to the series compact connection system.

19. The system of claim 1, wherein the system can be used without distinction in single phase or multi-phase supply systems.

20. The system of claim 1, further including software and hardware to carry out signal processing actions and/or functions of the processing means for these captured and/or injected voltage and/or current parameters or signals.

21. The system of claim 1, wherein the switchgear device is selected from a group consisting of a residual-current circuit breaker, a thermomagnetic circuit breaker, a contact breaker, a switch, a transformer and an overvoltage protector.

22. A compact connection system for a mains switchgear, comprising:
- a magnetic fastening element attached to at least one compact connection element by which the compact connection element is connectable to a switchgear device without mechanical connections;
- a body, wherein the compact connection element is attached to the body and the compact connection element operatively connects the body to the switchgear device;
- the magnetic fastening element being electrically connectable to a corresponding connection point or to any metal point for securing or connecting the wiring of the switchgear device, such that the compact connection system may receive an electrical signal from the mains switchgear connected to the switchgear device or send an electrical signal into the mains switchgear;
- the compact connection element having a rear portion that is fixed and a front portion that is axially compressible and is elongated to fit into a housing in the switchgear device, inside of which is the corresponding connection point, and the magnetic fastening element is attached to the front portion, whereby the magnetic fastening element allows the compact connection system to securably attach and detach the system from a switchgear device;
- the compact connection element being removably connectable to the switchgear device and configured to collect at least voltage signals from the mains switchgear when connected via the switchgear device; and
- a means for sensing and/or injecting current signals that flow through poles of the switchgear device, wherein a magnetic field present in the mains switchgear and/or effects of injected signals are detected.

* * * * *